United States Patent [19]

Peleckis

[11] Patent Number: 4,799,589
[45] Date of Patent: Jan. 24, 1989

[54] RESILIENT ELECTRONIC BANDOLIER CARRIER STRIP AND METHOD OF USING THE SAME

[75] Inventor: Anthony J. Peleckis, Fairfield, Conn.

[73] Assignee: Bead Chain Manufacturing Co., Bridgeport, Conn.

[21] Appl. No.: 83,846

[22] Filed: Aug. 7, 1987

[51] Int. Cl.⁴ .............................................. B65D 85/30
[52] U.S. Cl. ...................... 206/330; 29/845; 206/331
[58] Field of Search ................................ 206/328–334, 206/338; 29/739, 744, 759, 837, 845, 884; 439/493, 510

[56] References Cited

U.S. PATENT DOCUMENTS

| | | |
|---|---|---|
| 1,650,706 | 11/1927 | Gent . |
| 2,007,224 | 7/1935 | Stoekle . |
| 2,008,335 | 7/1935 | Nuyts . |
| 2,010,310 | 8/1935 | Long . |
| 2,135,134 | 11/1938 | Ehlers . |
| 2,256,995 | 9/1941 | Andres . |
| 2,273,099 | 2/1942 | Gilbert ................................ 206/328 |
| 2,433,346 | 12/1947 | Deakin . |
| 2,747,787 | 5/1956 | Davidson, Jr. . |
| 2,765,251 | 10/1956 | Williams . |
| 2,914,745 | 11/1959 | Krol et al. . |
| 2,966,618 | 12/1960 | Lehner . |
| 3,048,268 | 8/1962 | Rocchi et al. . |
| 3,135,375 | 6/1964 | Henn et al. . |
| 3,138,239 | 6/1964 | Ackerman et al. . |
| 3,140,773 | 7/1964 | Cheh . |
| 3,158,421 | 11/1964 | Hasenauer, Jr. . |
| 3,171,535 | 3/1965 | Harris ................................ 206/330 |
| 3,231,082 | 1/1966 | Weiss ................................ 206/330 |
| 3,353,138 | 11/1967 | Loose . |
| 3,437,460 | 4/1969 | Berg . |
| 3,500,289 | 3/1970 | Herb . |
| 3,551,875 | 12/1970 | Jarosek . |
| 3,574,935 | 4/1971 | Berg . |
| 3,582,864 | 6/1971 | Sullivan . |
| 3,591,922 | 7/1971 | Pardee . |
| 3,601,750 | 8/1971 | Mancini . |
| 3,601,786 | 8/1971 | Brubaker . |
| 3,605,237 | 9/1971 | Bakermans . |
| 3,612,747 | 10/1971 | Shlesinger, Jr. . |
| 3,615,283 | 10/1971 | Lang . |
| 3,664,015 | 5/1972 | Bakermans . |
| 3,702,104 | 11/1972 | Brubaker . |

(List continued on next page.)

FOREIGN PATENT DOCUMENTS

| | | |
|---|---|---|
| 1022231 | 6/1983 | U.S.S.R. ................................ 29/739 |
| 0774074 | 5/1957 | United Kingdom ................ 206/331 |
| 2046210 | 11/1980 | United Kingdom ................ 206/331 |

*Primary Examiner*—Jimmy G. Foster
*Attorney, Agent, or Firm*—Mattern, Ware, Stoltz & Fressola

[57] ABSTRACT

A bandolier carrier strip for carrying pin-like contact elements through a plating bath and for subsequent use in automated insertion apparatus is provided by a non-metallic strip-like base member of flexible non-conductive material with a layer of conductive material on at least one side thereof. The bandolier has a plurality of pairs of spaced apertures spaced longitudinally therealong. When the bandolier is flexed along its longitudinal center line, the apertures in a selected pair of apertures align allowing a pin-like contact element to be inserted therewithin. When the flexing action is released, the natural flexural characteristic of the bandolier tends to straighten out the same and cause the pin-like contact element to be releasably gripped in the apertures and placed in electrical contact with the conductive material on the surface of the strip-like base member. This process is repeated to load the pairs of spaced apertures with pin-like contact elements. During a subsequent plating operation, the conductive material on the bandolier permits an electrical charge to be applied to the pin-like contact elements through drive sprockets. The bandolier, with the pin-like contact elements loaded therein, is passed through an oppositely charged plating bath whereby the pin-like contact elements and the conductive layer are plated with plating material. Several different embodiments of the bandolier are illustrated and described.

44 Claims, 4 Drawing Sheets

U.S. PATENT DOCUMENTS

| | | | |
|---|---|---|---|
| 3,707,933 | 1/1973 | Berg . | |
| 3,777,349 | 12/1973 | Barnes . | |
| 3,829,818 | 8/1974 | Iosue et al. . | |
| 3,837,063 | 9/1974 | Wright . | |
| 3,841,472 | 10/1974 | Fuller et al. . | |
| 3,864,008 | 2/1975 | Bakermans et al. . | |
| 3,932,931 | 1/1976 | Wright . | |
| 4,033,657 | 7/1977 | Kemper . | |
| 4,045,750 | 8/1977 | Marshall . | |
| 4,049,118 | 9/1977 | Honda et al. | 206/330 |
| 4,058,881 | 11/1977 | Gavin et al. . | |
| 4,196,959 | 4/1980 | Chesemore et al. . | |
| 4,220,384 | 9/1980 | Clark et al. . | |
| 4,315,365 | 2/1982 | Wigby . | |
| 4,316,321 | 2/1982 | Wickham . | |
| 4,343,076 | 8/1982 | Ostapovitch . | |
| 4,349,106 | 9/1982 | Bogel . | |
| 4,372,040 | 2/1983 | Wickham . | |
| 4,376,338 | 3/1983 | Wickham . | |
| 4,401,354 | 8/1983 | Walter et al. . | |
| 4,606,455 | 8/1986 | Grikis et al. . | |
| 4,643,507 | 2/1987 | Colden . | |

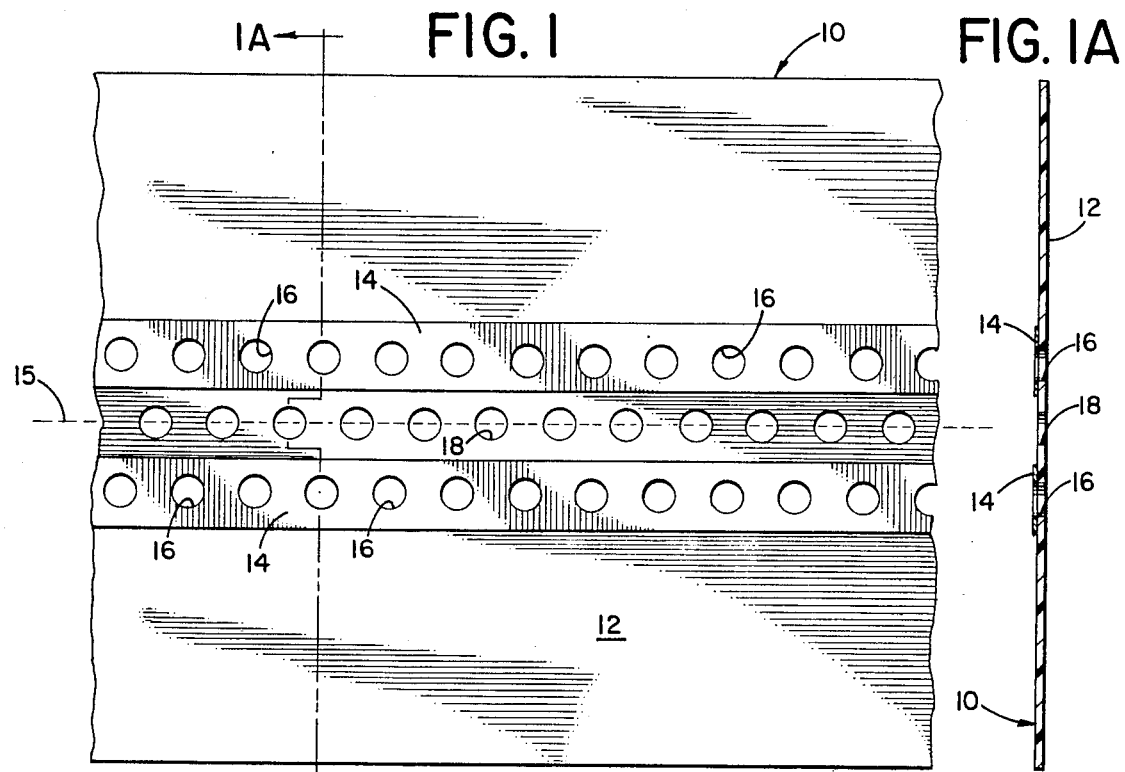
FIG. 1
FIG. 1A
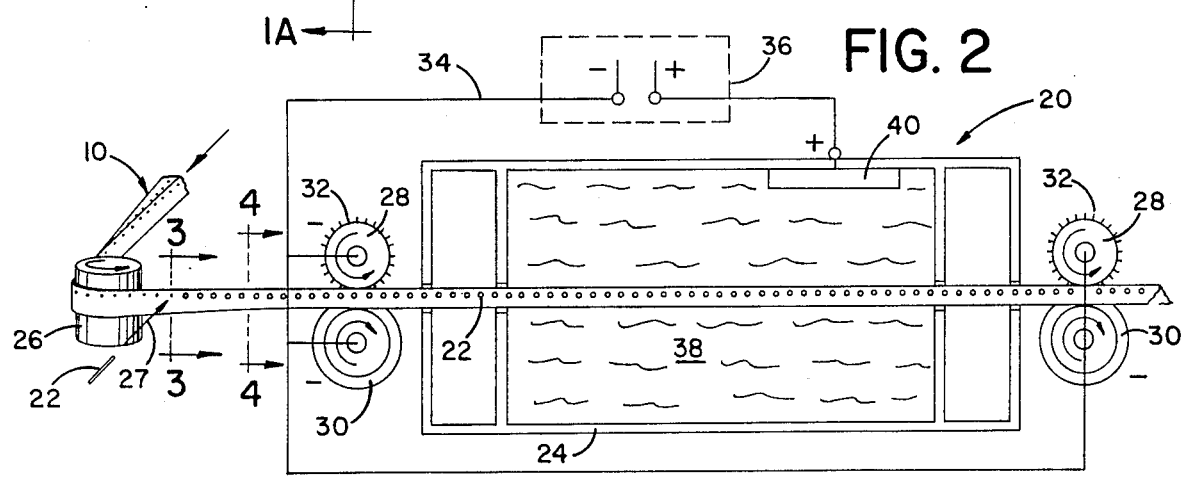
FIG. 2
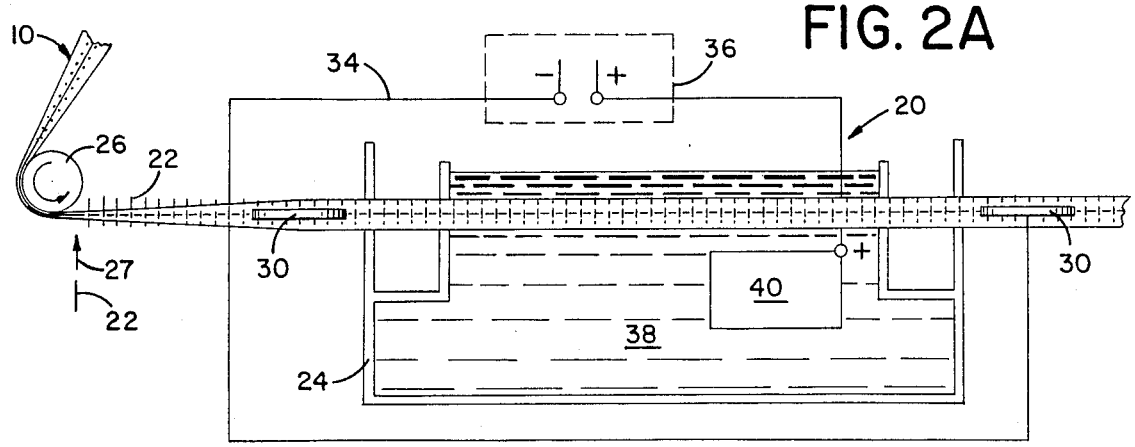
FIG. 2A

FIG. 3
FIG. 4
FIG. 5
FIG. 10
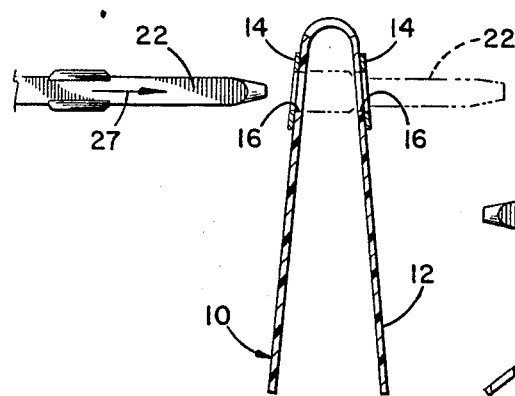
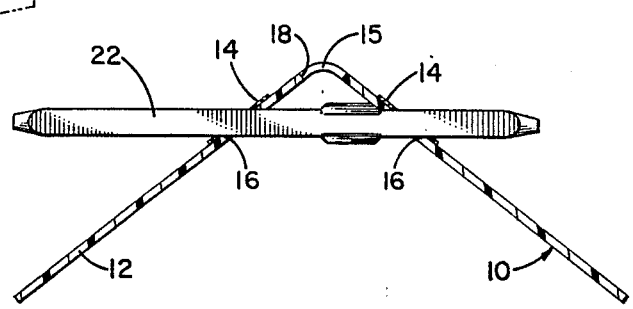
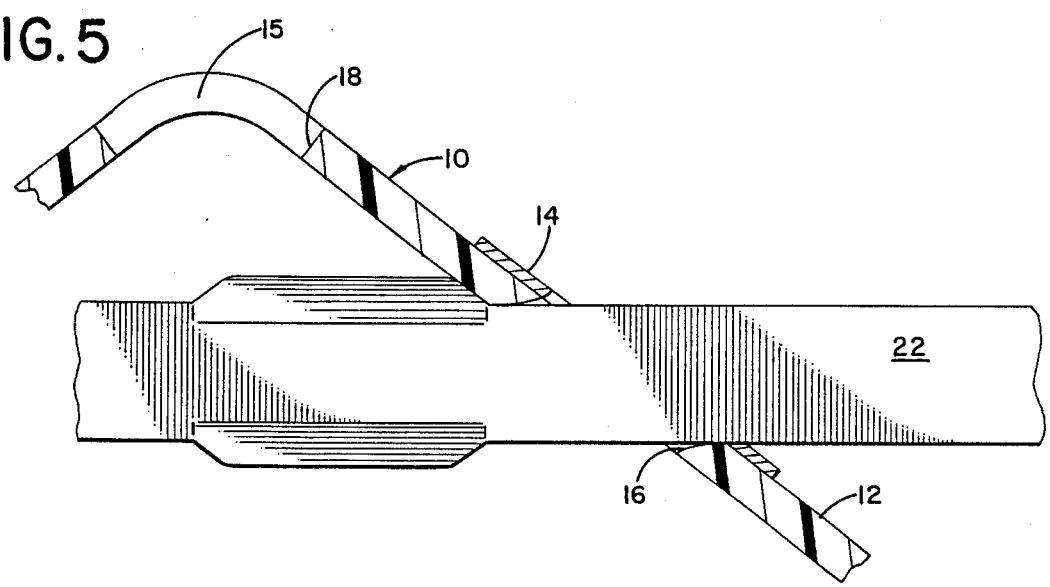
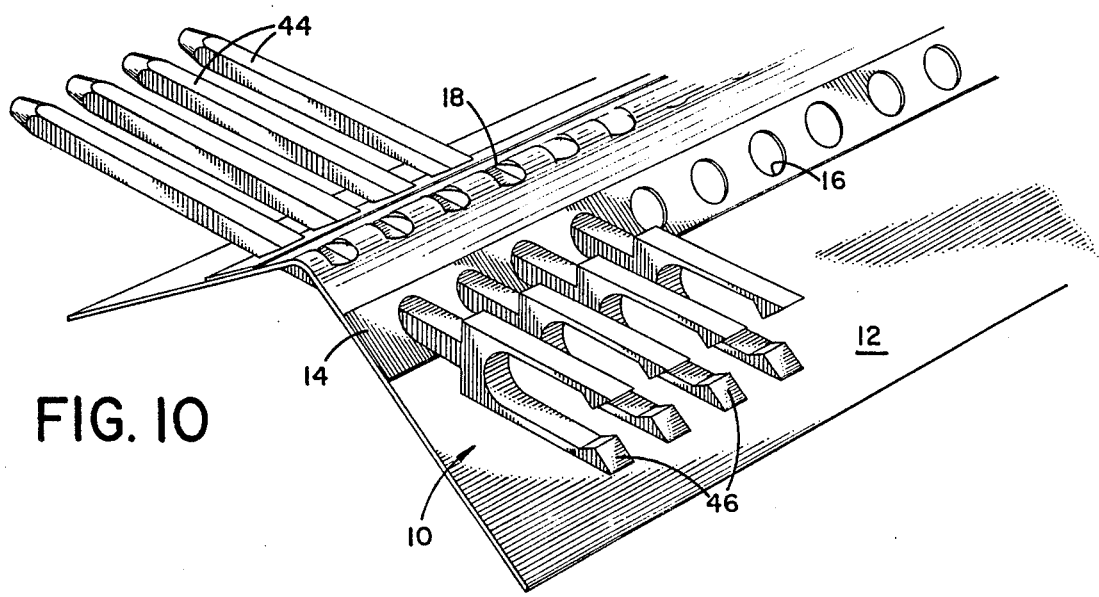

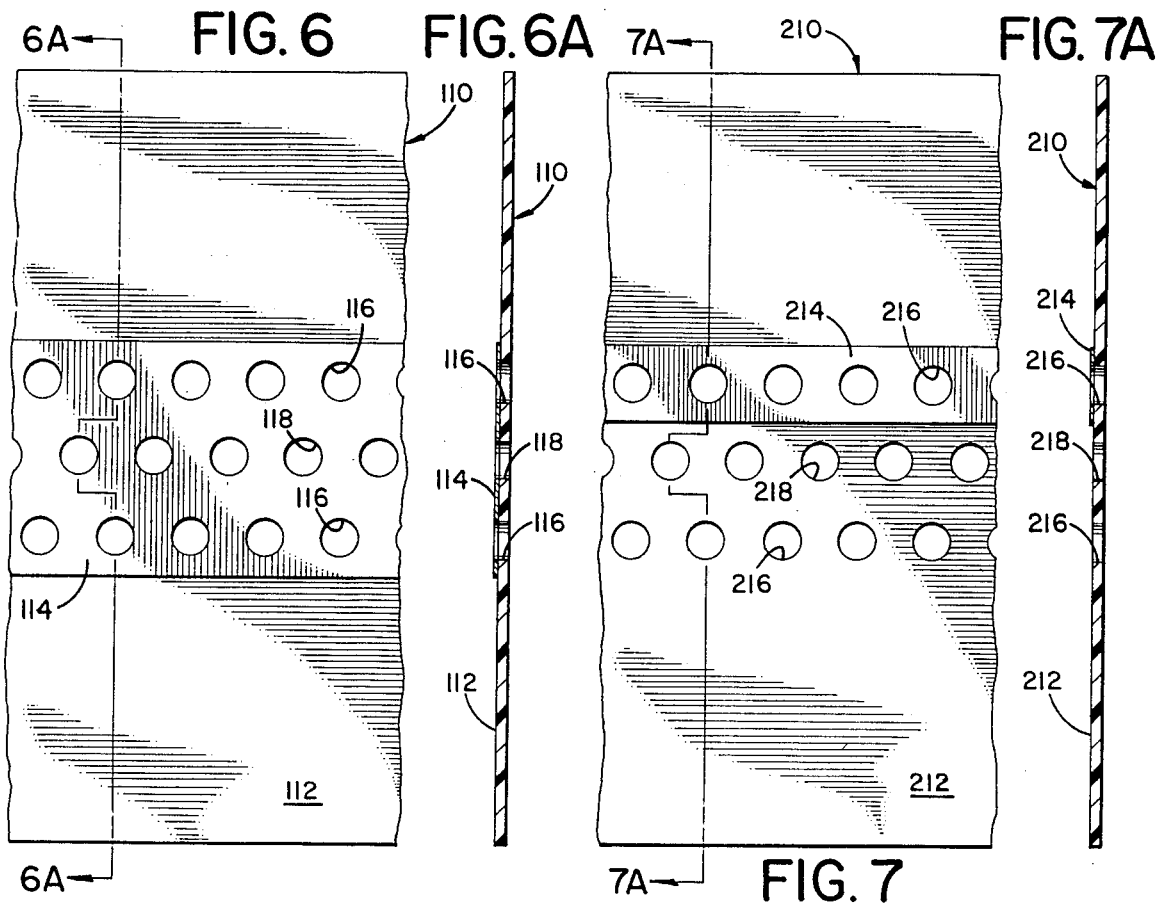
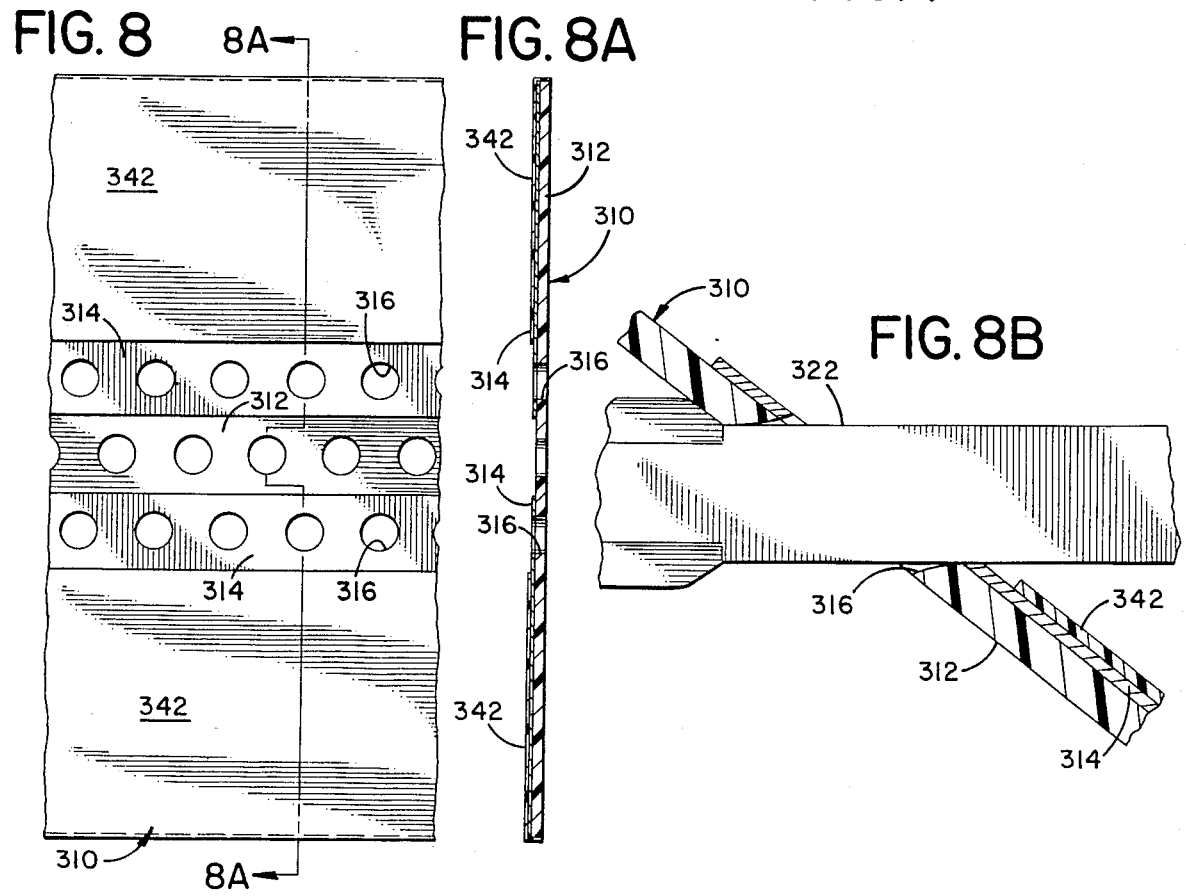

FIG. 9
FIG. 9A
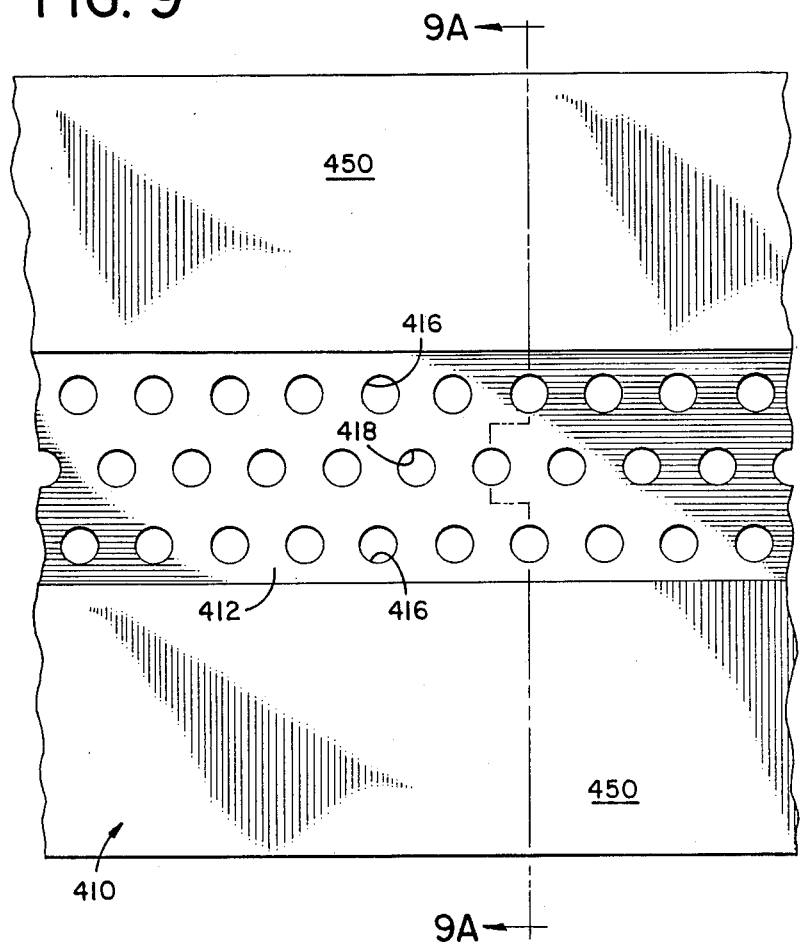
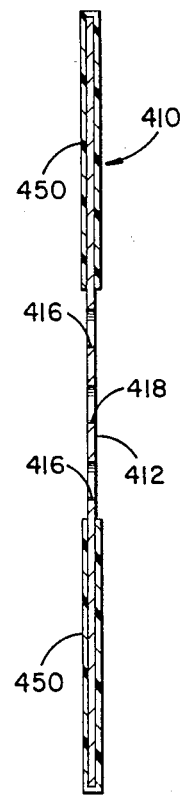

RESILIENT ELECTRONIC BANDOLIER CARRIER STRIP AND METHOD OF USING THE SAME

BACKGROUND OF THE INVENTION

The present invention relates generally to means for supplying automated insertion apparatus with a plurality of small pin-like contact elements and more particularly to a bandolier carrier strip and method for using the same in manufacturing pin-like elements and in connection with automated insertion apparatus.

High volume manufacturing of electronic components, especially printed circuit boards and connectors, requires rapid delivery of the pin terminals and elements to be inserted in the boards or connector housings by automated insertion apparatus. Generally, these terminals and elements such as post-header assemblies, compliant or wire wrap pin terminals and the like, to be inserted or used with printed circuit boards are miniature or sub-miniature in size and require special handling techniques to achieve the desired rapid delivery. In the past, in order to facilitate the handling of these pin terminals, they have been carried to the insertion apparatus by elongated strip carriers or bandoliers in which a plurality of pin terminals are releasably retained. In the insertion process, the bandolier, with its plurality of pin terminals, is fed into the insertion apparatus whereupon the individual pin terminals are removed from the bandolier and inserted, normally press-fit, into the appropriate position in its mating component or printed circuit board. This process is performed at a high pin count rate of operation.

Prior to the insertion operation, the pin terminals must be plated, utilizing an electrolytic or vacuum plating process, with various materials such as tin, tin-lead alloys, nickel, silver, gold, palladium etc. If the prior art metal bandoliers are used to transport the pin terminals through the plating bath, the metal bandolier will also be plated in the plating process. When precious metals are being used, this excess plating of the bandolier carrier can be extraordinarily wasteful of the precious metal plating material. Accordingly, there is a need for a bandolier and method for using the same which provides a low level of waste of the plating material during the manufacture of the pin terminals and which can also be used to efficiently and effectively deliver the pin terminals to the automated insertion apparatus. Further, the miniaturization or sub-miniaturization of contact pins requires closer spacing for higher densities than can be reasonably incorporated in metal carrier strips. Finally, because of the relatively small size of the parts being handled and the tendency of the prior art metal bandoliers to damage these parts, it would be beneficial to have a bandolier which would hold the parts firmly without damage thereto.

SUMMARY OF THE INVENTION

The present invention is designed to overcome the above-noted limitations that are attendant upon the use of the "prior art" methods and bandoliers, and toward this end, it contemplates the provision of a novel bandolier carrier strip and method of using the same.

It is an object of the present invention to provide a bandolier which will hold pin terminals during plating thereof and for subsequent use in connection with automated insertion apparatus.

It is also an object to provide such a bandolier which includes only a relatively small conductive layer thereon compared to the overall size of the bandolier in order to minimize waste of plating material.

A further object is to provide such a bandolier which can be easily loaded with pin terminals and permits the loaded pin terminals to be rotated therein once they are loaded.

Still another object of the invention is to provide such a bandolier capable of convenient and economical manufacture for use in high volume production.

It has now been found that the foregoing and related objects can be readily attained in a bandolier comprising an elongated strip-like base member of flexible, resilient and non-conductive material, such as a polymer of polyethylene terephthalate (PET), polyimide, polyester, etc., with a layer of conductive material, such as aluminum, copper or silver, on a portion of at least one side thereof. The elongated base member has a plurality of pairs of spaced apertures spaced longitudinally therealong. When the bandolier is flexed around its longitudinal center line, it attains a V-shaped cross-sectional profile whereby a plurality of pin-like elements can be inserted through the plurality of pairs of apertures of the bandolier with the natural flexural characteristics of the bandolier releasably holding the pin-like elements within the apertures. Each of the plurality of pin-like elements achieve electrical contact with the layer of conductive material. Another alternative form of bandolier is a very thin strip-like carrier of a flexible, resilient conductive material with insulation on both sides except for the area around the apertures.

Desirably, each of the plurality of pin-like elements is inserted through a selected pair of the plurality of apertures. The layer of conductive material can be on the convex and/or concave faces of the flexed bandolier and the pin-like elements achieve electrical contact with the layer by abutting the same. The selective use on the concave face aids in plating the portion of the pins within the confines of the bandolier.

Convenient)y, the plurality of pairs of spaced apertures are arranged in two rows whereby one member from each pair of spaced apertures is aligned in one row and the other members for each pair are aligned in another row. Further, the members of each pair of spaced apertures are transversely aligned.

The arrangement of the layer of conductive material can take many forms. In the preferred embodiment, the layer of conductive material is provided by two strips of conductive material extending parallel to and spaced from the longitudinal center line of the elongated strip-like base member. At least a portion of these strips can be overlaid with protective non-conductive coverlets to reduce the area which will be plated. Alternatively, the layer of conductive material can be a single strip of conductive material extending parallel to and spaced from the longitudinal center line of the elongated strip-like base member. In another embodiment, the layer of conductive material is a single strip of conductive material extending parallel to the longitudinal center line of the elongated strip-like base member and spanning the area between the rows of pin-retaining apertures.

Ideally, the base member has spaced registration drive apertures formed therein. The drive apertures are evenly spaced in a row along the longitudinal center line of the base member. The presence of these apertures acts to weaken the center line predicting the exact location where bending of the strip into "V" form will occur.

In using the above-described bandolier invention, at least a portion of the bandolier is flexed around its longitudinal axis to generally align a selected one of the pairs of pin-retaining apertures, a pin-like elements is provided and inserted into the selected one of the pairs of apertures, and the flex in the bandolier is then released whereby the natural flexural characteristics of the bandolier releasably retains the pin-like elements in electrical contact with the layer of conductive material. These steps are repeated to provide the bandolier with a plurality of spaced apart pin-like elements releasably retained therealong.

Subsequently, a plating bath is provided with an appropriate plating material therein and the material is given an electrical charge. The layer of conductive material and the plurality of pin-like elements in electrical contact therewith are provided with an electrical charge opposite of that provided to the plating material. The bandolier with the plurality of pin-like elements is fed through the plating material whereby the layer of conductive material and plurality of pin-like elements are plated by the plating material.

The invention accordingly comprises the features of construction, combinations of elements, and arrangements of parts which will be exemplified in the constructions hereinafter set forth, and the scope of the invention will be indicated in the claims.

For a fuller understanding of the nature and objects of the invention, reference should be had to the following detailed description taken in connection with the accompanying drawings.

BRIEF DESCRIPTION OF THE DRAWINGS

FIG. 1 is an enlarged top plan view of the first embodiment of the bandolier prepared in accordance with the present invention including two parallel conductive layers on a non-conductive substrate;

FIG. 1A is an enlarged cross-sectional view of the first embodiment taken along the 1A—1A line in FIG. 1;

FIGS. 2 and 2A are top and side schematic illustrations of a pin terminal transport and plating apparatus with the FIG. 1 bandolier carrying pin terminals through the plating bath for plating the same;

FIG. 3 is an enlarged cross-sectional view taken along the 3—3 line of FIG. 2 showing a pin terminal being inserted for retention by the FIG. 1 bandolier;

FIG. 4 is an enlarged cross-sectional view similar to FIG. 3 but taken downstream along the 4—4 line of FIG. 2 and showing a pin terminal releasably retained within a pair of aligned apertures of the FIG. 1 bandolier.

FIG. 5 is an enlarged view of a portion of FIG. 4 illustrating the electrical contact between the layer of conductive material and the retained pin terminal;

FIG. 6 is an enlarged top plan view of a second embodiment of the bandolier of the present invention with a single layer of conductive material on a non-conductive substrate, the single layer spans both rows of pin-retaining apertures;

FIG. 6A is an enlarged cross-sectional view of the second embodiment of the bandolier of the present invention taken along the 6A—6A line of FIG. 6;

FIG. 7 is an enlarged top plan view of a third embodiment of the bandolier of the present invention having only one layer of conductive material on the non-conductive substrate;

FIG. 7A is an enlarged cross-sectional view of the third embodiment of the bandolier of the present invention taken along the 7A—7A line of FIG. 7;

FIG. 8, is an enlarged top plan view of the fourth embodiment of the bandolier of the present invention which has the layer of conductive material in two strips extending parallel to one another on a non-conductive substrate with each of the conductive material strips partially covered by non-conductive material;

FIG. 8A is an enlarged cross-sectional view of the fourth embodiment of the bandolier of the present invention taken along the 8A—8A line of FIG. 8;

FIG. 8B is an enlarged cross-sectional view of the FIG. bandolier with a pin terminal therein showing the electrical contact between the pin terminal and the conductive layer;

FIG. 9 is an enlarged top plan view of a fifth embodiment of the bandolier of the present invention which has a conductive substrate covered by insulation;

FIG. 9A is an enlarged cross-sectional view of the fifth embodiment of the bandolier of the present invention taken along the 9A—9A line of, FIG. 9; and FIG. 10 is a perspective view of the FIG. 1 bandolier with a plurality of contact terminals assembled therein, the forked ends of the contact terminals are in parallel alignment.

DETAILED DESCRIPTION OF THE PREFERRED EMBODIMENTS

Turning first to FIGS. 1 and 1A of the drawings, therein illustrated is the first embodiment of the bandolier carrier strip of the present invention generally indicated by the numeral 10. The bandolier 10 is provided by an elongated strip-like base member 12 of a flexible, non-conductive substrate material. The non-conductive substrate material can be in the form of a plastic tape which can be made from various types of polymers. The polymer, polyethylene terephthalate, sold under the trade name MYLAR by E. I. du Pont de Nemours and Company, Wilmington, Del., has proven to be a satisfactory material in forming the elongated strip-like base member 12 because it is thermally, mechanically, and chemically stable when being used in subsequent processing of the pin-like elements, i.e. the process of plating and subsequent insertion, to be described hereinafter. This polyester polymer resists the acidic and alkaline cleaning solvents in the plating electrolytes employed in the manufacture of pin terminal elements for use with printed circuit boards. Temperature resistance of the material substrate assures that the elongated strip-like base member 12 will hold the loaded pin terminals being transported within the bandolier 10 firmly even at elevated temperatures. Other materials exhibiting the above-described characteristics could be used in forming the base member 12.

Located on one side of the elongated strip-like base member 12 is a layer 14 of conductive material arranged in two strips which run parallel to one another and the longitudinal center line 15 of the base member 12. The thickness of the conductive layer can vary, generally, ranging between 0.7 and 3.5 thousandths of an inch thick. The conductive material on the base member 12 can be of any metal or a metal alloy or some conductive composite but due to conductivity and cost the preferred materials are silver, aluminum or copper. These materials can be adhered to or metallized to the base member substrate using several well-known methods. For example, metallic inks can be used to print the conductive layer 14 on the substrate or the conductive layer 14 can be silk-screened directly onto the substrate. Additionally, the conductive layers 14 can be deposited on the substrate using vacuum vapor techniques or bonded thereto by adhesive. When an adhesive, such as any well-known pressure sensitive or thermally activated adhesive, is used, the conductive material can be provided in a strip form with an appropriate adhesive on one side thereof forming a laminate. The conductive strip is subsequently pressed into contact with the non-conductive substrate and, if necessary, for a thermally activated adhesive, the combined conductive strip and non-conductive substrate assembly is heated to bond the conductive strip 14 and non-conductive substrate together.

The bandolier 10 of FIGS. 1 and 1A is provided with a plurality of pin-retaining apertures 16 spaced longitudinally therealong. The pin-retaining apertures 16 are longitudinally aligned in two parallel rows which run along the layers of conductive material parallel to but spaced from the longitudinal center line 15 of the bandolier 10. The pin-retaining apertures 16 are also transversely aligned so that two transversely aligned apertures, one from each row, form a pair of spaced-apart apertures. The apertures 16 are generally formed in the bandolier 10 after the conductive layer 14 is applied to the base member 12 and can be circular shaped as shown or square.

Centrally located along the longitudinal center line 15 of the bandolier 10 is a row of drive apertures 18 dimensionally sized to accept drive sprockets as will be explained further hereinafter. It should be noted that the drive apertures 18 are located along the center line 15 of the bandolier 10 between adjacent pairs of spaced apertures 16.

Turning now to FIGS. 2 and 2A, therein illustrated is an apparatus generally indicated by numeral 20 for inserting pin terminals 22 into the bandolier 10 and plating the pin terminals 22 as they go through a plating bath 24. The apparatus 20 includes a capstan 26 located at the left-hand side thereof around which the bandolier 10 passes. As best seen in FIG. 3, as the bandolier 10 passes around capstan 26, it is flexed around or folded along its longitudinal center line 15 assuming a V-shaped cross section so that the axes of the apertures 16 of a pair of spaced apertures are substantially aligned thereby allowing pin terminal 22, slightly smaller than the apertures 16, to be inserted through them as indicated by arrow 27 to the phantom line position shown by an appropriate inserting apparatus (not shown). The location of the drive apertures 18 along the center line 15 promotes the V-shaped folding of the bandolier 10. The pin terminal 22 can take many different forms, for example, it can be a wire wrap pin to be used in connection with a printed circuit board. Such pins normally range between 0.175 inch and 1.5 inches in length and they are normally formed of 0.025 inch to 0.45 inch square wire with chamfered, conically tapered or pyramidally revolved ends. These pin terminals may be fabricated of phosphor bronze, brass alloys, beryllium, copper, copper-nickel-tin alloys, or other conductive workable metals. Generally, they must be plated with tin, tin-lead alloys, nickel, silver, gold, palladium, etc. The cross-sectional shape of these pin terminals can be round or have a semi-circular shape as well as being of a square or rectangular form as shown.

From the loading station at capstan 26, bandolier 10, with its plurality of loaded pin terminals 22, is fed forward under the influence of two pairs of mating drive sprockets 28 and 30 toward the plating bath 24. The upper drive sprockets 28 have drive teeth 32 which register with the drive apertures 18 in the bandolier 10 to drive the same. As the bandolier 10 moves away from the capstan 26, its natural flexural characteristics or elastic memory cause it to try to straighten out or to expand from the flexed position shown in FIG. 3 to the pin-retaining position shown in FIG. 4 where it gently and releasably grips the pin terminal 22. As best seen in FIG. 5, as the natural flexural characteristics of the bandolier 10 cause it to straighten or expand outwardly, the pin terminal 22 is brought into electrical contact with the layer 14 of conductive material on the outer surface of the bandolier 10. It should be understood that the bandolier 10 can also be flexed to a position where the conductive layer 14 is on the concave side thereof rather than the convex side as shown in FIGS. 3-4. With the conductive layer 14 on the concave side, the semi-shielded portions of the pins 22 within the confines of the bandolier 10 are more readily plated as current density is increased.

The drive sprockets 28 and 30 of the apparatus are connected through electrical line 34 to a negative terminal or cathode of a direct current (DC) power supply 36 of the plating apparatus. The presence of the conductive layer 14 on the surface of the bandolier 10 along with the electrical contact between the conductive layer 14 and the plurality of pin terminals 22 releasably held by the bandolier 10 permits the negative charge from the power supply 36 to be conducted through the drive sprockets 28 and 30 to the individual pin terminals 22 spaced along the bandolier 10.

The plating bath 24 holds an appropriate plating material 38 which is provided with a positive charge through an anode 40 of the power supply 36. The bandolier 10 with its negatively charged plurality of pin terminals 22 is fed through the plating bath 24 for a sufficient amount of time to provide the desired amount of plating. Normally, a thickness of approximately thirty (30) to fifty (50) microinches of precious metal over nickel or copper base plating is plated on the pin terminals 22. As the bandolier 10 leaves the plating bath 24, it can be fed directly into an automated insertion apparatus (not shown) where the plated pin terminals 22 are inserted into printed circuit boards or, alternatively, the bandolier 10 can be rolled for storage, sale and subsequent use in the insertion apparatus by the customer.

Although the pin terminals 22 are shown totally submerged in the plating bath 24 in FIGS. 2 and 2A, the vertical orientation of the pin terminals 22 permits selective vertical plating of them, i.e., the pin terminals 22 can be partially submerged in the plating bath 24 and thereby partially plated, if desired.

In some instances, it may be necessary to clean the pin terminals 22 in a cleaning bath prior to or following plating. The bandolier 10 provides an excellent and convenient means to transport the pin terminals 22 though an appropriate cleaning bath as needed.

It should be readily appreciated that the conductive layers 14 on the bandolier 10 will be plated along with the pin terminals 22 held in the bandolier 10. However, because of the relatively small size of the conductive layer 14 compared to the overall size of the bandolier 10, only a small portion of plating material is wasted in plating the conductive layer 14. It should be appreciated by those skilled in the art that the amount of gripping pressure exerted on and conductivity to the pin terminals 22 can be controlled without deformation of the pin terminals 22 by varying various characteristics of the bandolier 10. The characteristics include (1) the type of polymer (i.e., the flexural characteristics of the polymer), (2) the thickness of the polymer and (3) the spacing and size of pin and drive apertures 16 and 18. The present preferred embodiment for pins having a 0.018 inch diameter with a 0.023 inch fluted star upset utilizes 0.005 inch thick and 0.5 inch wide carrier base member 12 made from polyethylene terephthalate having a layer 14 comprising two parallel strips of 0.004 inch thick and 0.05 inch wide copper thereon. The strips are spaced 0.050 inch from one another. All apertures 16 and 18 (pin and drive) have 0.026 inch diameters and the center-to-center spacing of adjacent apertures in their rows is 0.050 inch while the center-to-center spacing of members of each pair of pin-retaining apertures 16 is 0.1 inch. The contemplated ranges are as follows:

Pin terminal aperture 16 (diameter or square) =0.012 inch to 0.135 inch
Center-to-center spacing of members of pair of pin-retaining apertures =0.030 inch to 0.250 inch
Center-to-center spacing of adjacent apertures in their respective rows =0.025 inch to unlimited.

Referring now to FIGS. 6 and 6A, a second embodiment of the bandolier generally indicated by numeral 110 is illustrated. In this embodiment, the conductive layer 114 spans between and beyond both rows of pin-retaining apertures 116 on the base member 112 and the centrally located drive apertures 11 rather than having two separate strips as in the first embodiment. This embodiment is used in a manner similar to the first embodiment and provides a slightly improved conduction of electrical power to the individual pin terminals but increases the waste of plating material as the conductive layer 114 presents a larger area to be plated.

In FIGS. 7 and 7A, a third embodiment of the bandolier of the present invention is illustrated and generally indicted by numeral 210. This embodiment is similar to the first embodiment but layer 214 is a single strip of conductive material on the non-conductive substrate 212. Apertures 216 and 218 are equivalent to apertures 16 and 18 of the first embodiments. It should be appreciated that the amount of plating material waste associated with this embodiment will be decreased by about fifty percent (50%) as compared to the first embodiment; however, the bandolier 210 will not provide the same level of conduction of electrical power during the plating operation as exhibited by bandolier 10.

In FIGS. 8, 8A and 8B, a fourth embodiment of the bandolier of the present invention is generally indicated by numeral 310. This embodiment is quite similar to the embodiment of FIGS. 1 and 1A; however, the strips of the conductive layer 314 on the non-conductive base member 312 extend to the edges thereof and essentially all of the portions of the conductive layer 314 outboard of the rows of pin-retaining apertures 316 are provided with non-conductive coverlets 342 which cover portions of the conductive layer 314 and extend around the outer ends of the non-conductive base member 312. As best seen in FIG. 8B, the conductive layer 314 is still in position to come into electrical contact with pin terminal 322 inserted within and releasably retained in a pair of aligned apertures 316 (only one shown in FIG. 8B). The bandolier 310 provides less of an area to be plated than the bandolier 10 as it is fed through the plating bath 24 of FIG. 2 and, therefore, is useful in delivering the same amount of electrical current to the pin terminals as the first embodiment but providing less waste of plating material. This feature is particularly critical when the plating operation is taking place with a precious metal such as gold.

Referring to FIGS. 9 and 9A, yet another form of the bandolier of the present invention is shown and generally designated by the numeral 41. In this embodiment, the elongated strip-like base member 412 is prepared from a conductive metal such as tin in the form of a strip having a thickness of 0.0005 inch to 0.0025 inch. Selectively coated on the base member 412 is an insulating layer 450 intended to prevent plating in the coated areas. The insulating layer 450 can be varnish, polytetrafluoroethylene or other suitable materials. The bandolier 410 is also provided with pin-retaining apertures 416 and drive apertures 418.

In FIG. 10, there is illustrated the bandolier 10 of the present invention shown in use with a different type of contact terminal, i.e., card edge connectors 44 instead of wire wrap pins 22. The card edge connectors 44 are initially fabricated using a stamping process with forked ends all horizontal one to another. Subsequently, they can be inserted into the bandolier 10, and rotated around their longitudinal axis while being retained by the bandolier with the forked ends in the parallel position shown in FIG. 10. This particular orientation of the card edge connectors 44 has not previously been possible with prior art carriers and facilitates insertion of the card edge connectors 46 with insertion apparatus.

If it is unnecessary to plate the pin terminals, in which case an electrical charge does not have to be applied to the pin terminals, the invention contemplates providing a bandolier prepared from solely a non-conductive substrate material. Alternatively, if plating is unnecessary or if the waste of plating material is of little consequence, the bandolier can be made entirely of a conductive material.

Additionally, instead of using the bandolier in a plating process, it can also be used as the charging or biasing means in continuous vacuum coating processes for coating the pin terminals.

It will thus be seen that the objects set forth above, and those made apparent in the preceding description, are efficiently attained and, since certain changes may be made in carrying out the above method and in the constructions of the bandolier set forth without departing from the scope of the invention, it is intended that all matter contained in the above description and shown in the accompanying drawings shall be interpreted as illustrative and not in a limiting sense.

I claim:
1. A bandolier for use in combination with a plurality of pin-like contact elements for facilitating plating and orientation thereof and delivery thereof to automated insertion apparatus comprising:
   an elongated strip-like base member of flexible, resilient and non-conductive material with a layer of conductive material on a portion of at least one side thereof, said elongated base member having a plurality of pairs of spaced apertures spaced longitudinally therealong and in position to permit said base member to be flexed around its longitudinal center line to allow a pin-like element to be inserted through a selected pair of said plurality of pairs of apertures and achieve electrical contact with said layer of conductive material.

2. The bandolier in accordance with claim 1, wherein said plurality of pairs of spaced apertures are arranged in two rows whereby one member from each pair of spaced apertures is aligned in one row and the other members for each pair are aligned in another row.

3. The bandolier is accordance with claim 2, wherein said members of each pair of spaced apertures are transversely aligned.

4. The bandolier in accordance with claim 1, wherein said layer of conductive material is a strip of conductive material extending parallel to and spaced from the longitudinal center line of said elongated strip-like base member.

5. The bandolier in accordance with claim 1, wherein said layer of conductive material is two strips of conductive material extending parallel to and spaced from the longitudinal center line of said elongated strip-like base member.

6. The bandolier in accordance with claim 1, wherein said layer of conductive material is a strip of conductive material extending parallel to the longitudinal center line of said elongated strip-like base member.

7. The bandolier in accordance with claim 1, wherein at least a portion of said layer of conductive material is covered by a non-conductive coverlet.

8. The bandolier in accordance with claim 1, wherein said plurality of pairs of spaced apertures extend through said layer of conductive material.

9. The bandolier in accordance with claim 1, wherein said carrier member has spaced registration drive apertures formed therein.

10. The bandolier in accordance with claim 9, wherein said drive apertures are evenly spaced in a row along the longitudinal center line of said base member.

11. The bandolier in accordance with claim 1, wherein said flexible, non-conductive material is a polymer material.

12. The bandolier in accordance with claim 11, wherein said polymer material is a polyester material.

13. The bandolier in accordance with claim 11, wherein said polymer material is polyethylene terephthalate.

14. The bandolier in accordance with claim 1, wherein said conductive layer is chosen from a group consisting of aluminum, copper, silver, gold, alloys thereof and conductive polymers.

15. A bandolier for use in combination with a plurality of pin-like contact elements for facilitating plating and orientation thereof and delivery thereof to automated insertion apparatus comprising:

an elongated strip-like member of flexible, resilient material, said elongated member having a plurality of pairs of spaced apertures spaced longitudinally therealong, said plurality of pairs of spaced apertures are arranged in two rows whereby one member from each pair of spaced apertures is aligned in one row and the other member of each pair of spaced apertures is aligned in the other row, said spaced apertures in position to permit said elongated strip-like member to be flexed around its longitudinal center line to allow a pin-like element to be inserted through a selected pair of said plurality of pairs of apertures, said elongated strip-like member is made of a conductive material and has a layer of non-conductive material on at least one side thereof.

16. The bandolier in accordance with claim 15 wherein said layer of non-conductive material covers substantially the entire surface area of said elongated strip-like member except the area between said spaced apart apertures.

17. In combination:
A. a plurality of pin-like elements;
B. bandolier means comprising n elongated strip-like base member of flexible, resilient and non-conductive material with a layer of conductive material on a portion of at least one side thereof, said elongated base member having a plurality of pairs of spaced apertures spaced longitudinally therealong, said bandolier flexed around its longitudinal center line to have a V-shaped cross-sectional profile, said plurality of pin elements inserted through said plurality of pairs of apertures, each of said plurality of pin-like elements achieving electrical contact with said layer of conductive material.

18. The combination in accordance with claim 17, wherein the natural flexural characteristics of said bandolier releasably hold said pin elements within said apertures.

19. The combination in accordance with claim 17, wherein each of said plurality of pin elements is inserted into a selected pair of said plurality of apertures.

20. The combination in accordance with claim 17, wherein said layer of conductive material is on the convex face of said flexed bandolier and said pin elements achieve electrical contact with said layer by abutting the same.

21. The combination in accordance with claim 17, wherein said plurality of pairs of spaced apertures are arranged in two rows whereby one member from each pair of spaced apertures is aligned in one row and the other members for said pairs are aligned in another row.

22. The combination in accordance with claim 21, wherein said members of each pair of spaced apertures are transversely aligned.

23. The combination in accordance with claim 17, wherein said layer of conductive material is a strip of conductive material extending parallel to and spaced from the longitudinal center line of said elongated strip-like base member.

24. The combination in accordance with claim 17, wherein said layer of conductive material is two strips of conductive material extending parallel to and spaced from the longitudinal center line of said elongated strip-like base member.

25. The combination in accordance with claim 17, wherein said layer of conductive material is a strip of conductive material extending parallel to the longitudinal center line of said elongated strip-like base member.

26. The combination in accordance with claim 17, wherein at least a portion of said layer of conductive material is covered by a non-conductive coverlet.

27. The combination in accordance with claim 17, wherein said plurality of pairs of spaced apertures extend through said layer of conductive material.

28. The combination in accordance with claim 17, wherein said base member has spaced registration drive apertures formed therein.

29. The combination in accordance with claim 28, wherein said drive apertures are evenly spaced in a row along the longitudinal center line of said base member.

30. The combination in accordance with claim 17, wherein said flexible, non-conductive material is a polymer material.

31. The combination in accordance with claim 30, wherein said polymer material is a polyester material.

32. The combination in accordance with claim 30, wherein said polymer material is polyethylene terephthalate.

33. The combination in accordance with claim 17, wherein said conductive layer is chosen from a group consisting of aluminum, copper, silver, gold, alloys thereof and conductive polymers.

34. In combination:
A. a plurality of pin-like elements; and
B. bandolier means comprising an elongated strip-like member of flexible, resilient material, said elongated member having a plurality of pairs of spaced apertures spaced longitudinally therealong, said plurality of pairs of spaced apertures are arranged in two rows whereby one member from each pair of spaced apertures is aligned in one row and the other member of each pair of spaced apertures is aligned in the other row, said members of each pair of spaced apertures are transversely aligned, said bandolier flexed around its longitudinal center line to have a V-shaped cross-sectional profile, said plurality of pin elements inserted through said plurality of pairs of apertures with one pin-like element in each pair of spaced apertures.

35. The combination in accordance with claim 34, wherein member is made of a conductive material.

36. The combination in accordance with claim 35 of non-conductive material on at least one side of said elongated strip-like member.

37. The combination in accordance with claim 36, wherein non-conductive material covers substantially the entire surface area of said elongated strip-like member except the area between said spaced apart apertures.

38. The combination in accordance with claim 35, wherein each of said plurality of pin-like elements achieves electrical contact with said conductive material.

39. The combination inn accordance with claim 34, wherein the natural flexural characteristics of said bandolier releasably hold said pin-like elements within said apertures.

40. A method of preparing pin-like elements for use in an automated insertion apparatus comprising the steps of:

A. providing a bandolier carrier strip comprised of an elongated strip-like base member of flexible, resilient and non-conductive material with a layer of conductive material on a portion of at least one side thereof, said elongated base member having a plurality of pairs of spaced apertures spaced longitudinally therealong and in position to permit said base member to be flexed around its longitudinal center line to allow a pin-like element to be inserted through a selected pair of said plurality of apertures and achieve electrical contact with said layer of conductive material;
B. flexing at least a portion of said bandolier around its longitudinal center line to generally align a selected one of said pairs of apertures;
C. providing a pin-like element for insertion into said selected one of said pairs of apertures;
D. inserting said pin-like elements through said selected one of said pairs of apertures; and
E. releasing the flex in said base member whereby the natural flexural characteristics of said base member releasably retains said pin-like element in electrical contact with said layer of conductive material.

41. The method in accordance with claim 40 further comprising: repeating steps B through E to provide said bandolier with a plurality of spaced apart pin-like elements releasably retained therealong.

42. The method in accordance with claim 41 further comprising the steps of: providing a plating bath with an appropriate plating material therein and providing said material with an electrical charge; providing said layer of conductive material and said plurality of pin-like elements in electrical contact therewith with an electrical charge opposite of that provided to said plating material; and feeding said bandolier with said plurality of pin-like elements through said plating material whereby at least a portion of said layer of conductive material and plurality of pin-like elements are plated by said plating material.

43. The method in accordance with claim 40 further including the step of: rotating said pin-like elements about their longitudinal axis.

44. The method in accordance with claim 43 wherein said pin-like elements are held by said bandolier against longitudinal movement during said rotating step.

* * * * *

UNITED STATES PATENT AND TRADEMARK OFFICE
CERTIFICATE OF CORRECTION

PATENT NO. : 4,799,589

DATED : January 24, 1989

INVENTOR(S) : Anthony J. Peleckis

It is certified that error appears in the above—identified patent and that said Letters Patent is hereby corrected as shown below:

```
Column 4, line 14, after "FIG." add --8--.
Column 7, line 12, "0.004" should be --0.0014--.
Column 7, line 32, "11" should be --118--.
Column 8, line 9, "41", should be --410--.
Column 10, line 6, "n" should be --an--.
```

Signed and Sealed this

Thirteenth Day of June, 1989

Attest:

DONALD J. QUIGG

Attesting Officer

Commissioner of Patents and Trademarks